(12) United States Patent
Danjean et al.

(10) Patent No.: US 10,388,368 B2
(45) Date of Patent: Aug. 20, 2019

(54) ADAPTIVE READ THRESHOLD VOLTAGE TRACKING WITH CHARGE LEAKAGE MITIGATION USING CHARGE LEAKAGE SETTLING TIME

(71) Applicant: Seagate Technology LLC, Cupertino, CA (US)

(72) Inventors: Ludovic Danjean, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/799,497

(22) Filed: Oct. 31, 2017

(65) Prior Publication Data
US 2019/0130967 A1    May 2, 2019

(51) Int. Cl.
*G11C 11/56*    (2006.01)
*G11C 16/22*    (2006.01)

(52) U.S. Cl.
CPC ...... *G11C 11/5642* (2013.01); *G11C 11/5635* (2013.01); *G11C 16/22* (2013.01)

(58) Field of Classification Search
CPC .. G11C 11/5642; G11C 11/5635; G11C 16/22
USPC .................................................. 365/185.03
See application file for complete search history.

(56) References Cited

U.S. PATENT DOCUMENTS

| | | |
|---|---|---|
| 4,713,776 A | 12/1987 | Kraseki |
| 6,590,798 B1 | 7/2003 | Komatsuzaki |
| 8,289,781 B2 | 10/2012 | Litsyn et al. |
| 8,576,625 B1 | 11/2013 | Yang et al. |
| 8,693,257 B2 | 4/2014 | Sridharan et al. |
| 9,036,413 B2 | 5/2015 | Wu et al. |
| 9,086,982 B1 | 7/2015 | Xu et al. |
| 9,122,626 B2 | 9/2015 | Kim et al. |
| 9,378,083 B2 | 6/2016 | Ghaly et al. |
| 9,417,797 B2 | 8/2016 | Chen et al. |
| 9,563,502 B1 | 2/2017 | Alhussien et al. |
| 9,761,325 B1 | 9/2017 | Shi |
| 2007/0291546 A1* | 12/2007 | Kamei ............... G11C 11/5628 365/185.22 |
| 2007/0291556 A1 | 12/2007 | Kamei |
| 2008/0084754 A1 | 4/2008 | Mokhlesi |

(Continued)

*Primary Examiner* — Anthan Tran
(74) *Attorney, Agent, or Firm* — Ryan, Mason & Lewis, LLP

(57) ABSTRACT

Adaptive read reference voltage tracking techniques are provided that employ charge leakage mitigation. An exemplary device for use with multi-level memory cells, comprises a controller configured to: after a predefined time interval that approximates a settling time after a programming of the multi-level memory cells until a charge leakage of one or more of the multi-level memory cells has settled, determine a plurality of read reference voltages for the multi-level memory cells using a post-programming adaptive tracking algorithm; and employ the plurality of read reference voltages to read data from the multi-level memory cells. The reference voltage offsets are optionally determined based on a shift in the read reference voltages after the predefined time interval since the programming of the multi-level memory cells.

20 Claims, 13 Drawing Sheets

(56) References Cited

U.S. PATENT DOCUMENTS

| | | | |
|---|---|---|---|
| 2009/0319722 A1* | 12/2009 | Murin | G11C 16/28 |
| | | | 711/103 |
| 2010/0265374 A1 | 10/2010 | Nishi | |
| 2011/0157439 A1 | 6/2011 | Sawada et al. | |
| 2012/0102259 A1* | 4/2012 | Goss | G11C 7/04 |
| | | | 711/103 |
| 2012/0134213 A1 | 5/2012 | Choi et al. | |
| 2012/0254699 A1 | 10/2012 | Ruby et al. | |
| 2014/0226398 A1 | 8/2014 | Desireddi et al. | |
| 2014/0286102 A1 | 9/2014 | Wu et al. | |
| 2015/0357050 A1 | 12/2015 | Bailey et al. | |
| 2016/0093352 A1 | 3/2016 | Jung et al. | |
| 2016/0267968 A1 | 9/2016 | Murooka | |
| 2017/0125089 A1 | 5/2017 | Sankaranarayanan et al. | |
| 2017/0125110 A1 | 5/2017 | Sankaranarayanan et al. | |
| 2017/0125111 A1 | 5/2017 | Sankaranarayanan et al. | |
| 2017/0125114 A1 | 5/2017 | Alhussien et al. | |
| 2018/0101190 A1 | 4/2018 | Lee | |
| 2018/0181462 A1 | 6/2018 | Shukla et al. | |

* cited by examiner

ADAPTIVE READ THRESHOLD VOLTAGE TRACKING WITH CHARGE LEAKAGE MITIGATION USING CHARGE LEAKAGE SETTLING TIME

CROSS-REFERENCE TO RELATED APPLICATIONS

The present application is related to U.S. patent application Ser. No. 15/799,484, entitled "Adaptive Read Threshold Voltage Tracking With Charge Leakage Mitigation Using Threshold Voltage Offsets," filed contemporaneously herewith (now U.S. Pat. No. 10,276,233), and incorporated by reference herein in its entirety.

FIELD

The field relates generally to solid-state storage media and, more particularly, to adjustments of read reference voltages for such solid-state storage media.

BACKGROUND

Solid-state storage devices can shift over time. For example, memory cell leakage (often referred to as charge leakage), memory cell damage and other disturbances to memory cells can alter the read voltage levels of the memory cells. Thus, the read reference voltages can shift over time. If the read voltage level of a memory cell shifts past a read reference voltage, a data error occurs, as the value of the data read from the memory cell is different than the value of the data that was written to the memory cell. Adaptive reference voltage tracking algorithms track variations in the solid-state storage channel and, consequently, help maintain a set of updated channel parameters. The updated channel parameters are used, for example, to adjust the read reference voltages.

After a non-volatile memory page is programmed, charge leakage can be observed through the tunnel oxide impacting the voltage distribution and the read reference voltages. This phenomenon is often referred to as quick-charge loss, short term data retention or low temperature data retention (LTDR). The charge leakage can negatively impact post-programming activities including the adaptive reference voltage tracking algorithm. The charge leakage usually settles within a matter of minutes but depends on, for example, the media type, the media generation and the usage condition (such as temperature and number of program-erase cycles).

A need exists for improved techniques for adapting read reference voltages that mitigate for such charge leakage effects.

SUMMARY

Adaptive read reference voltage tracking techniques are provided that employ charge leakage mitigation. In one embodiment, a device for use with multi-level memory cells, comprises a controller configured to: after a predefined time interval that approximates a settling time after a programming of the multi-level memory cells until a charge leakage of one or more of the multi-level memory cells has settled, determine a plurality of read reference voltages for the multi-level memory cells using a post-programming adaptive tracking algorithm; and employ the plurality of read reference voltages to read data from the multi-level memory cells.

In some embodiments, the reference voltage offsets are determined based on a shift in the read reference voltages after the predefined time interval since the programming of the multi-level memory cells.

Other illustrative embodiments include, without limitation, apparatus, systems, controllers, methods and computer program products comprising processor-readable storage media.

DETAILED DESCRIPTION

Figure 1:
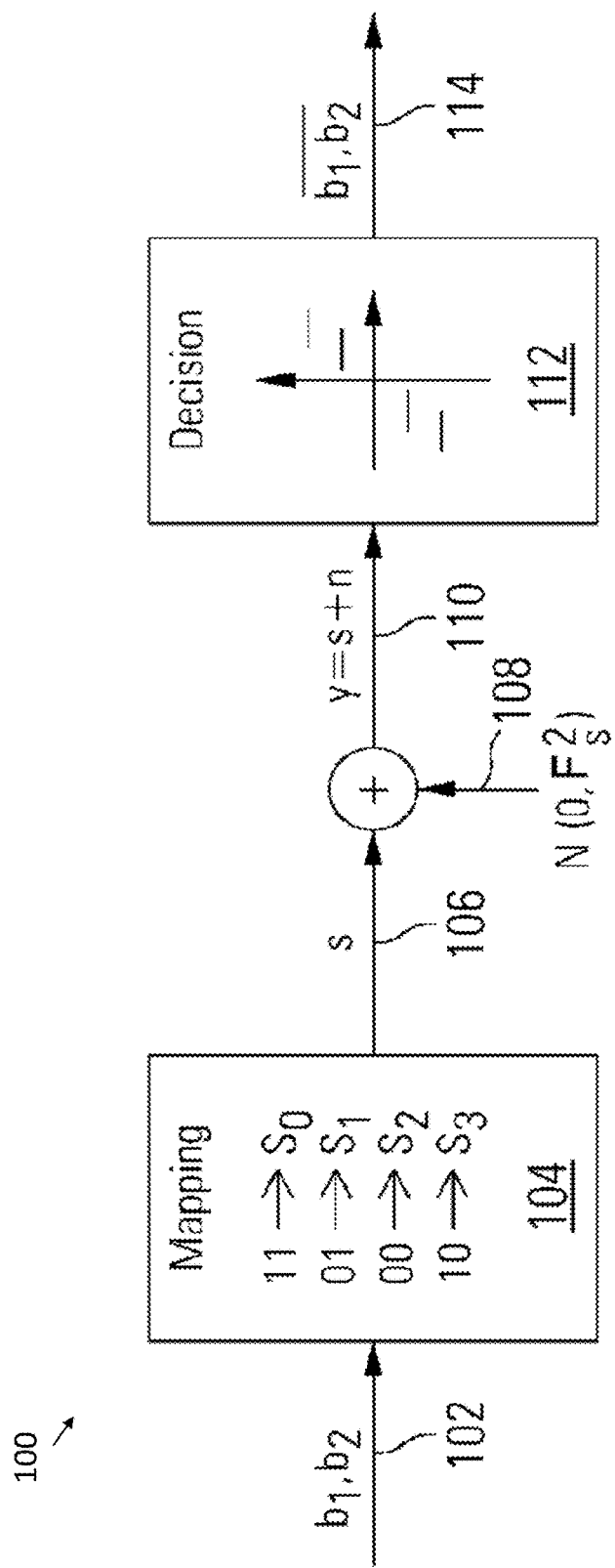
FIG. 1 illustrates a model of a non-volatile memory channel in which channel tracking can be used to adjust read retry reference voltages, in accordance with one or more embodiments of the present disclosure.

Illustrative embodiments will be described herein with reference to exemplary solid-state storage devices and associated storage media, controllers, and other processing devices. It is to be appreciated, however, that these and other embodiments are not restricted to the particular illustrative system and device configurations shown. Accordingly, the term "solid-state storage device" as used herein is intended to be broadly construed, so as to encompass, for example, any storage device implementing the charge leakage mitigation techniques described herein.

Numerous other types of storage systems are also encompassed by the term "solid-state storage device" as that term is broadly used herein.

As noted above, charge loss or charge gain in the memory cells may lead to data errors such that data read from the memory cells does not correspond to the originally stored data. The number of errors can be decreased by modifying the read reference voltages (e.g., $V_T$) used to read data stored in the memory cells. Charge loss occurs when charge leaks from the floating gate of the memory cell causing the voltage of the memory cell to shift in the negative voltage direction. Disturb effects can occur when neighboring cells are read or programmed. Disturb effects can cause the voltage of the memory cell to shift to the positive voltage direction.

As noted above, charge leakage can negatively impact post-programming activities including the adaptive reference voltage tracking algorithm. The charge leakage usually settles within a matter of minutes but depends on, for example, the media type, the media generation and the usage condition (such as temperature and number of program-erase cycles).

In one or more embodiments, adaptive read reference voltage tracking techniques are provided with charge leakage mitigation, using reference voltage offsets and/or charge leakage settling time. Thus, in one or more embodiments, the impact of the charge leakage phenomenon is mitigated as an enhancement to the adaptive read reference voltage tracking algorithm by accounting for the time variation in the voltage distribution of the non-volatile memory in order to obtain improved read reference voltage values.

In NAND flash terminology, a threshold voltage typically refers to the amount of charge stored in a cell and a read reference voltage (sometimes referred to as a read threshold voltage) is the threshold voltage of a cell that is compared against upon a read operation. For instance, if the threshold voltage of a cell is less than the read reference voltage, then the cell is said to store bit-1.

One or more embodiments of the disclosure recognize that voltage distributions are still "evolving" for a certain amount of time following the programming of a memory or a portion of the memory (e.g., a flash page, a flash block or a flash die). Thus, performing an adaptive tracking of the reference voltages immediately after programming may lead to some unsatisfactory reference voltages once the charge leakage settles (potentially leading to a higher bit error rate during read operations and a longer latency to recover the data).

Various embodiments of the disclosure are directed to post-programming reference voltage adjustment techniques for solid-state memory devices, such as single-level cell (SLC) or multi-level cell (MLC) NAND (Not And) flash memory devices. As used herein, a multi-level cell flash memory comprises a memory where each memory cell stores two or more bits. While the disclosure is illustrated herein using memory cells that store an analog value as a voltage, the present disclosure can be employed with any storage mechanism for memory devices, such as the use of voltages or currents to represent stored data, as would be apparent to a person of ordinary skill in the art.

Embodiments of the disclosure adjust a read reference voltage for a memory using post-programming adaptive reference voltage tracking techniques to address variations in the read reference voltages as the solid-state storage media evolves and/or degrades.

In one exemplary embodiment, a controller determines read reference voltages using a post-programming adaptive tracking algorithm and one or more reference voltage offsets for the read reference voltages based on shifts in the read reference voltage over time. The read reference voltages are shifted using the determined reference voltage offsets and the shifted read reference voltages are used to read data from the multi-level memory cells.

In another exemplary embodiment, a controller waits a predefined charge leakage settling time before determining the read reference voltages, using a post-programming adaptive tracking algorithm. The read reference voltages are used to read data from the multi-level memory cells.

Techniques are also provided for determining the offsets to apply to the read reference voltages. Generally, in one or more embodiments, the offsets are based on a measured shift in the read reference voltages over time. As noted above, the read reference voltages for the multi-level cell are shifted by their respective voltage offset values and are used to read data from the multi-level memory cells.

Considered individually, each non-volatile memory cell has a particular stored (programmed) charge that corresponds to a device threshold voltage for that cell, and further corresponds to the logical bit values being stored in the cell. While, ideally, all of the cells in the non-volatile memory would have identical device threshold voltages for the logical bit values stored, in practice, for a variety of reasons, the device threshold voltages follow a probability distribution, e.g. a Gaussian distribution. Thus, considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^N-1$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distributions can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of read retry operations is performed to recover the read unit. The read retry operations include the controller re-reading the read unit with different reference voltages, as adjusted based on channel tracking.

The adaptive read reference voltage tracking techniques disclosed herein can be applied to both single-level cell (SLC) flash memories, where N=1, and to multi-level cell (MLC) flash memories, where N>1. Single-level cell memories store one bit per cell of storage, have two device reference voltage distributions (one for zeroes and another for ones), and use a single read threshold, read reference voltage $V_{REF0}$. From lower to higher device reference voltages, the two device reference voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is are also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when zeroes (state E) and ones (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E, or by searching for $V_{REF}$ that minimizes the bit errors of the read operation. For a multi-level memory cell, the tracking module typically estimates the means and variances of the voltage distributions of all states.

The memory cells of a memory device can be grouped into data units referred to herein as data pages or blocks. A data page can correspond, for example, to a group of memory cells that are read together during a read operation. A group of memory pages that are erased at substantially the same time may be referred to as a block or erasure unit. Memory cells are programmed in units of pages and, after programming, the pages are not re-programmed until after the block of pages is erased. Garbage collection operations can be performed on the blocks of pages, wherein the blocks are erased after active data stored in each block is moved to another location. Thus, as a result of garbage collection, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

FIG. 1 illustrates a model of a non-volatile memory channel 100 in which channel tracking can be used to adjust read retry reference voltages in accordance with one or more embodiments of the present disclosure. Notably, two-bit inputs with four states are used in this example, although the read retry reference voltage adjustment disclosed herein is not limited to use with any particular bit width or number of states. For two input data bits 102, the two data bits 102 $b_1$, $b_2$ can be mapped to four possible states in a mapping 104. For example, value "11" for the two data bits 102 can be mapped to state $s_0$, value "01" to state $s_1$, value "00" to state $s_2$, and value "10" to state $s_3$. For a multi-level cell, the cell is programmed to a selected state 106 from the four possible states depending on the value of the two data bits 102. As voltages representing the selected state 106 are written to and read from the memory cell, noise 108 is added due to the programming process and other inefficiencies and disturbances, yielding a noisy cell voltage 110 $y$. The noise can be considered to be an additive white Gaussian noise (AWGN), with the noise variances being different depending on the signal transmitted. In general, a decision 112 is made based on whether the read voltage associated with the noisy cell voltage 110 $y$ is above or below a predefined reference voltage 220. The decision 112 indicates that the memory cell is determined to be in a particular state, having a corresponding bit assignment 114 for $b_1$, $b_2$.

Figure 2:
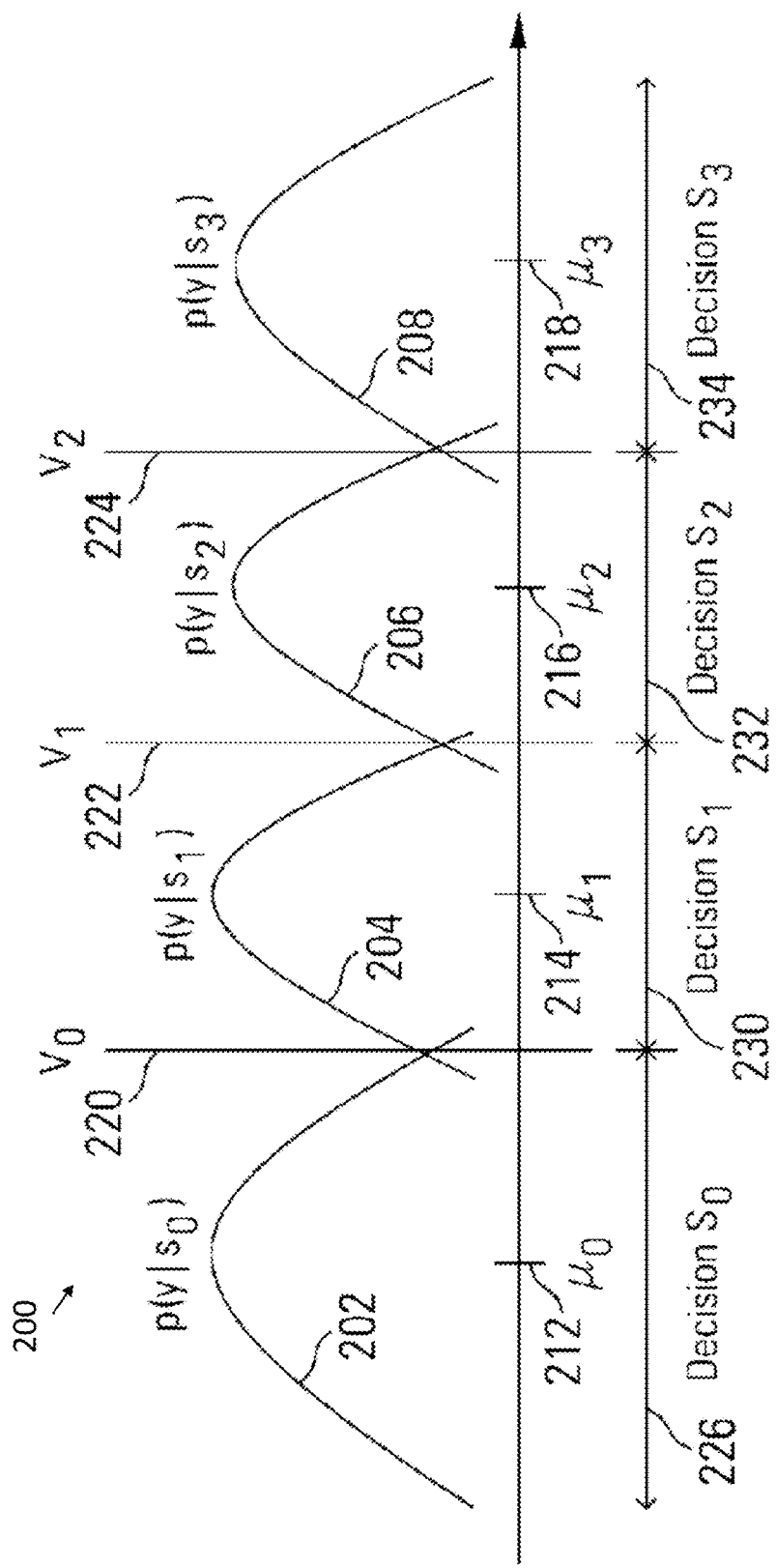
FIG. 2 is a graph of cell voltage distributions for a normal hard decision read, in accordance with some embodiments of the present disclosure.

FIG. 2 is a graph 200 of cell voltage distributions 202, 204, 206, 208 for a normal hard decision read in accordance with some embodiments of the present disclosure. The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 are used during a read to determine the state of the memory cell, returning hard decisions about the state of the memory cell.

In general, if the read voltage is below reference voltage 220, a decision (112, FIG. 1) indicates that the memory cell is determined to be in state $S_0$ 226. If the read voltage is above reference voltage $V_0$ 220 and below reference voltage $V_1$ 222, a decision indicates that the memory cell is determined to be in state $S_1$ 230. If the read voltage is above reference voltage $V_1$ 222 and below reference voltage $V_2$ 224, a decision indicates that the memory cell is determined to be in state $S_2$ 232. If the read voltage is above reference voltage $V_2$ 224, a decision indicates that the memory cell is determined to be in state $S_3$ 234.

In one or more embodiments of the present disclosure, discussed further below in conjunction with FIGS. 6 and 8A through 8C, the reference voltages $V_0$ 220, $V_1$ 222 and $V_2$ 224 used during a read operation to determine the state of the memory cell are shifted using one or more reference voltage offsets, as discussed further below. In a further embodiment, discussed further below in conjunction with FIGS. 7, 9A and 9B, the reference voltages $V_0$ 220, $V_1$ 222 and $V_2$ 224 used during a read operation to determine the state of the memory cell are not determined until a predefined period of time after a programming of the multi-level memory cells until a charge leakage of the multi-level memory cells has settled.

In some embodiments, the read operation is divided into a process of reading least significant bit (LSB) pages and most significant bit (MSB) pages. States $S_0$ 226 and $S_1$ 230 correspond to a least significant bit value of 1, states $S_2$ 232 and $S_3$ 234 correspond to a least significant bit value of 0. When reading the least significant bit, the reference voltage $V_1$ 222 is applied to the memory cell, and if the voltage on the cell is above reference voltage $V_1$ 222, the least significant bit is interpreted as having a value of 0. If the voltage on the cell is below reference voltage $V_1$ 222 the least significant bit is interpreted as having a value of 1. States $S_0$ 226 and $S_3$ 234 are less likely to result in a read error than states $S_1$ 230 and $S_2$ 232, because their distributions 202 and 208 are further from the intersection of distributions 204, 206 associated with reference voltage $V_1$ 222. When reading the most significant bit, states $S_0$ 226 and $S_3$ 234 correspond to the most significant bit value of 1, and states $S_1$ 230 and $S_2$ 232 correspond to the most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the disclosure.

When reference voltages $V_0$ 220, $V_1$ 222 and $V_2$ 224 are used during a read to determine the state of the memory cell, it can result in a misread due to overlapping regions for neighboring distributions. For example, if the actual written state is $S_0$ corresponding to target state voltage level 212, but the read voltage is at the upper edge of distribution 202 above reference voltage $V_0$ 220, the decision will incorrectly identify state $S_1$ 230. In these cases, if low density parity check decoding of the data read from the non-volatile memory does not converge on the correct values and correct the errors, a retry operation is initiated.

During the read retry operation, the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
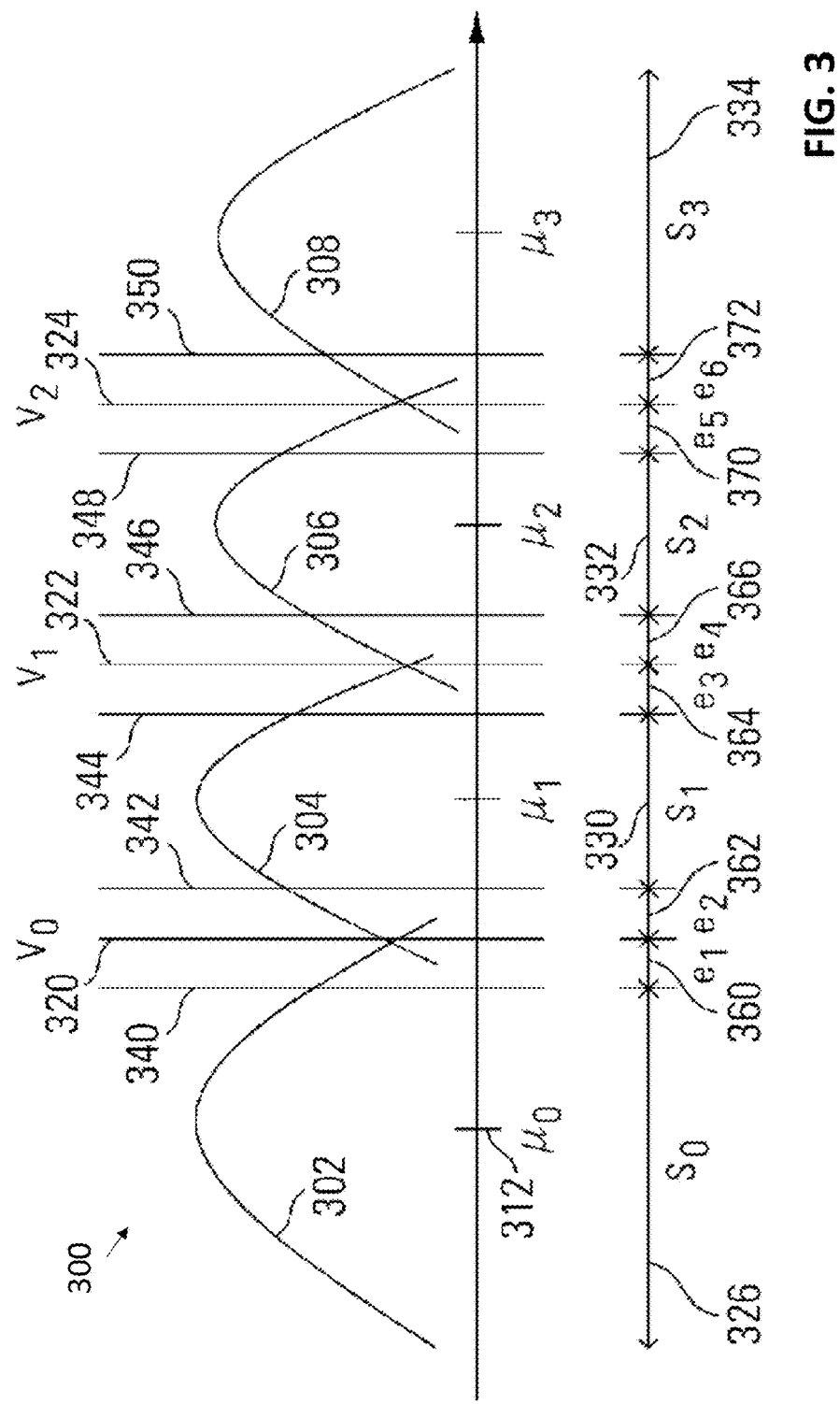
FIG. 3 is a graph of cell voltage distributions for cell voltages in different states for a retry soft decision read, in accordance with some embodiments of the present disclosure.

FIG. 3 is a graph 300 of cell voltage distributions 302, 304, 306, 308 for cell voltages in different states for a retry soft decision read in accordance with some embodiments of the present disclosure. During read retries, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $S_0$ 326, $S_1$ 330, $S_2$ 332, and $S_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when reading a least significant bit page, reference voltages 344, 322, 346 are applied in a series of read operations to determine if the least significant bit is a "0", with the memory cell in either state $S_2$ 332, or $S_3$ 334, or if the least significant bit is a "1", with the memory cell in either state $S_0$ 326, $S_1$ 330. Given three reference voltages 344, 322, 346, the hard decisions will have three bit values. Although reference voltages can be applied in a number of different orders, affecting the hard decision results, one example of the hard decision values for three reference voltages 344, 322, 346 applied in that order is as follows. If the read voltage is below all three reference voltages 344, 322, 346 to the left of reference voltage 344, the hard decision is {111}. If the read voltage is above reference voltage 344 and below reference voltages 322, 346, the hard decision is {011}. If the read voltage is above reference voltages 344, 322 and below reference voltage 346, the hard decision is {001}. If the read voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a "0", with the memory cell in either state $S_1$ 330 or $S_2$ 332, or if the most significant bit is a "1", with the memory cell in either state $S_0$ 326 or $S_3$ 334. If the read voltage is below reference voltage 340, the hard decision is {111}. If the read voltage is between reference voltages 340 and 320, the hard decision is {011}. If the read voltage is between reference voltages 320 and 342, the hard decision is {001}. If the read voltage is between reference voltages 342 and 348, the hard decision is {000}. If the read voltage is between reference voltages 348 and 324, the hard decision is {100}. If the read voltage is between reference voltages 324 and 350, the hard decision is {110}. If the read voltage is above reference voltage 350, the hard decision is {111}.

Notably, the likelihood that the value read from a memory cell is correct differs based on the state that is read. For example, if the read retry results in a hard decision corresponding to state $S_0$ 326, the likelihood that the memory cell actually contains the value associated with target state voltage level 312 is greater than if the read retry results in a hard decision corresponding to state $e_1$ 360, because state $S_0$ 326 is further from the intersection of distributions 302 and 304 than state $e_1$ 360.

The hard decisions of read operations can be converted into soft decisions (log likelihood ratio values) based on the knowledge of the channel. The hard decision for state $S_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the read retry operation hard decisions in any suitable manner. Based upon the disclosure provided herein, one of ordinary skill in the art will recognize a variety of techniques and equations for calculating log likelihood ratio values from the read retry operation hard decisions. In some embodiments, the log likelihood ratio values are pre-calculated for each possible read retry operation hard decision, based on expected channel characteristics, and stored in a lookup table for use during operation.

In some embodiments, when data from a read retry operation fails to converge in the decoder, another read retry operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

The adjustment of read retry reference voltages disclosed herein adjusts the reference voltages to achieve a prescribed log likelihood ratio table that is designed to achieve low density parity check decoding convergence with a lower number of read retries.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using three signed bits, the range of possible log likelihood ratios is from −7 to 7. In one or more embodiments, channel tracking is performed and an algorithm is applied to inversely find the read reference voltages that will use the full resolution of possible log likelihood ratios, rather than concentrating the log likelihood ratios at the edges of the available range.

In some embodiments, the channel tracking-based read reference voltage adjustment is applied in a read retry operation. In these embodiments, a hard read is performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the read retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identify the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identifies the read reference voltages that will result in quantized voltages that map to log likelihood ratios that use the full resolution. By utilizing the full log likelihood ratio resolution, the low density parity check decoding is able to converge on the correct written values in a lower number of read retries. With proper choice of read reference voltages, it is observed that the limited spectrum of log likelihood ratios does not impair performance of the low-density parity-check decoder. In some embodiments, the low density parity check decoding comprises a min-sum decoding algorithm, although the channel tracking-based read retry voltage adjustment is not limited to use with any particular type of decoder.

Figure 4:
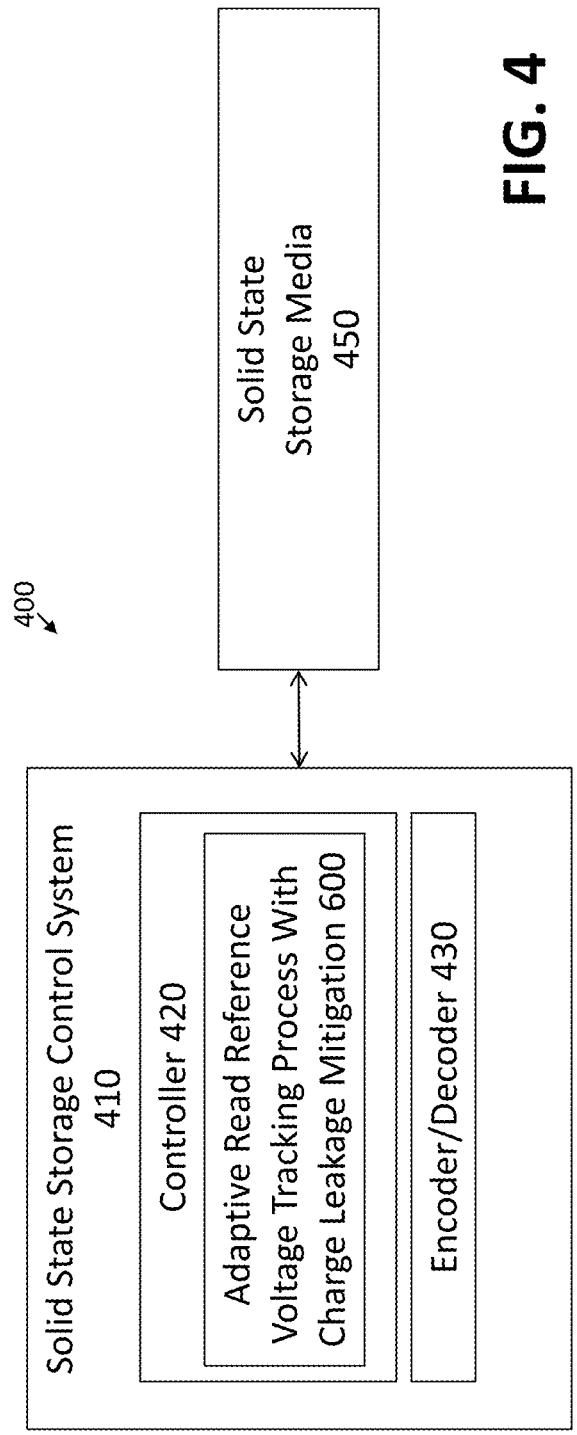
FIG. 4 is a schematic block diagram of a solid-state storage system, in an illustrative embodiment of the present disclosure.

FIG. 4 is a schematic block diagram of an illustrative solid-state storage system 400. As shown in FIG. 4, the illustrative solid-state memory system 400 comprises a solid-state storage control system 410 and a solid-state storage media 450. The exemplary solid-state storage control system 410 comprises a controller 420 and an encoder/decoder block 430. In an alternative embodiment, the encoder/decoder block 430 may be implemented inside the controller 420.

As shown in FIG. 4, the controller 420 comprises an adaptive read reference voltage tracking process with charge leakage mitigation 600, discussed below in conjunction with FIG. 6 (and an alternative implementation of the adaptive read reference voltage tracking process with charge leakage mitigation 600 is discussed further below in conjunction with FIG. 7), to implement the charge leakage mitigation techniques described herein. The encoder/decoder block 430 may be implemented, for example, using well-known commercially available techniques and/or products. The encoder within the encoder/decoder block 430 may implement, for example, error correction encoding, such as a low-density parity-check (LDPC) encoding. The decoder within the encoder/decoder block 430 may be embodied, for example, as a hard decision decoder, such as a hard decision low-density parity-check (HLDPC) decoder.

The solid-state storage media 450 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM). While the disclosure is illustrated primarily in the context of a solid-state storage device (SSD), the disclosed charge leakage mitigation techniques can be applied in solid-state hybrid drives (SSHD) and other storage devices, as would be apparent to a person of ordinary skill in the art based on the present disclosure.

Figure 5:
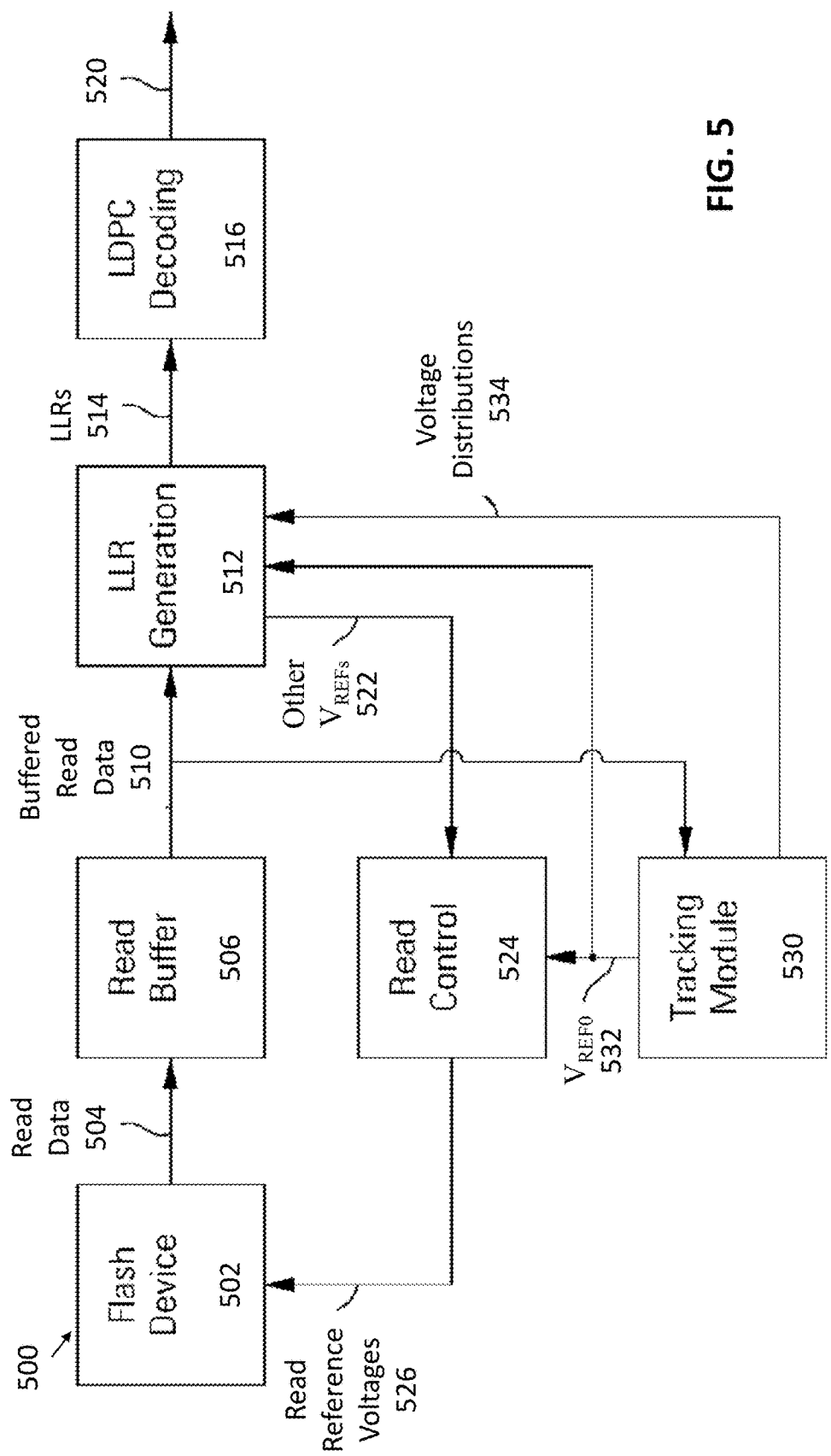
FIG. 5 illustrates a flash channel read path with adaptive read reference voltage tracking, in accordance with some embodiments of the present disclosure.

FIG. 5 illustrates a flash channel read path 500 with channel tracking-based read retry voltage adjustment in accordance with some embodiments of the present disclosure. The read path 500 includes a flash device having an array of memory cells, or any other type of non-volatile memory. Based upon the disclosure provided herein, one of ordinary skill in the art will recognize a variety of storage technologies that can benefit from the bit error rate-based read reference voltage adjustments disclosed herein.

Read reference voltages 526 are applied to the flash device 502 by a read control device 524 in a series of N reads. Each memory cell is read N times, and the N reads result in read data 504 containing N bits per memory cell as a quantized version of the stored voltage on the memory cell. The read data 504 is buffered in a read buffer 506, and buffered read data 510 from read buffer 506 is provided to a log likelihood ratio generation circuit 512 (or likelihood generator, which can also be adapted to use plain likelihood values). The N bits for a memory cell are mapped to log likelihood ratios 514 for the memory cell in log likelihood ratio generation circuit 512. In some embodiments, the log likelihood ratio generation circuit 512 contains a lookup table that maps the read patterns in buffered read data 510 to log likelihood ratios 514.

A tracking module 530 receives the buffered read data 510 from the read buffer 506, or from any other suitable source. Generally, channel tracking techniques adapt to the changes in read reference voltages to maintain a desired performance level. Adaptive tracking algorithms typically track variations in the solid-state storage channel and consequently, help to maintain a set of updated channel parameters. The updated channel parameters are used, for example, to adjust read reference voltages. United States Published Patent Application No. 2013/0343131, filed Jun. 26, 2012, entitled "Fast Tracking For Flash Channels," and/or United States Published Patent Application No. 2015/0287453, entitled "Optimization of Read Thresholds for Non-Volatile Memory," (now U.S. Pat. No. 9,595,320) incorporated by reference herein in their entirety, disclose techniques for adapting read reference voltages.

The tracking module 530 identifies the intersection point between neighboring voltage distributions (e.g., 302, 304) for a memory cell that corresponds to zero log likelihood ratio, and provides read reference voltage level $V_{REF0}$ 532, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional read reference voltages around $V_{REF0}$ to obtain substantially all possible log likelihood ratio values. The tracking module 530 thus generates the read reference voltage level $V_{REF0}$ 532 to be used in read retry operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 512 and 524.

The tracking module 530 also tracks the voltage distributions 534 (e.g., 302, 304). In some embodiments, the tracking module 530 calculates the voltage distribution means and variances for each voltage distribution 534 corresponding to each possible state in each memory cell. The voltage distributions 534 can be calculated in any suitable manner based on the read data. As an example, the tracking module 530 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 530 tracks intersections without estimating means or variances.

For a two-state memory cell, or single-level memory cell, the tracking module 530 estimates the means and variances of the voltage distributions of states "1" and "0", as well as the read reference voltage $V_{REF0}$ that most reduces the bit error rate and which likely lies at the intersection of those distributions when 0's and 1's are equally likely in the written data.

The tracking module 530 provides the voltage distributions 534 to the log likelihood ratio generation circuit 512 for use in updating the log likelihood ratio lookup table. The log likelihood ratio generation circuit 512 is used to calculate likelihood values 514 for decoding by an LDPC (low-density parity-check) decoder 516 that generates decoded data 520. The log likelihood ratio generation circuit 512 also determines where to place the other N−1 read reference voltages around $V_{REF0}$ 532 based on the voltage distributions 534 and on the read reference voltage $V_{REF0}$ 532 to obtain substantially all possible log likelihood ratio values when the read patterns in buffered read data 510 are mapped to log likelihood ratios. The log likelihood ratio generation circuit 512 determines where to place the other N−1 read reference voltages around $V_{REF0}$ 532, updates the lookup table, and provides the N−1 read reference voltage levels 522 to a read controller 524. It is important to note that the division of functionality is not limited to the example embodiments disclosed herein. For example, in other embodiments, the tracking module 530 calculates and provides read reference voltages around $V_{REF0}$ 532 and provides those voltages to the log likelihood ratio generation circuit 512, rather than the log likelihood ratio generation circuit 512 determining where to place the other N−1 read reference voltages around $V_{REF0}$ 532, and these divisions of functionality are to be seen as equivalent.

The read reference voltages are stored in log likelihood ratio generation circuit 512 in some embodiments, as calculated based on the log likelihood ratio lookup table in log likelihood ratio generation circuit 512 and on the voltage distribution means and variances 534 from tracking module 530.

The read controller 524 controls read retry operations in the flash device 502, providing each of the N read reference voltages (including $V_{REF0}$ 532) to be used when reading the memory cells in the flash device 502. The read controller 524 initiates N reads of a page, with the first read using read reference voltage $V_{REF0}$ in some embodiments, and with the subsequent N−1 reads at read references voltages around $V_{REF0}$ as determined by log likelihood ratio generation circuit 512.

Adaptive Read Reference Voltage Tracking with Charge Leakage Mitigation

Figure 6:
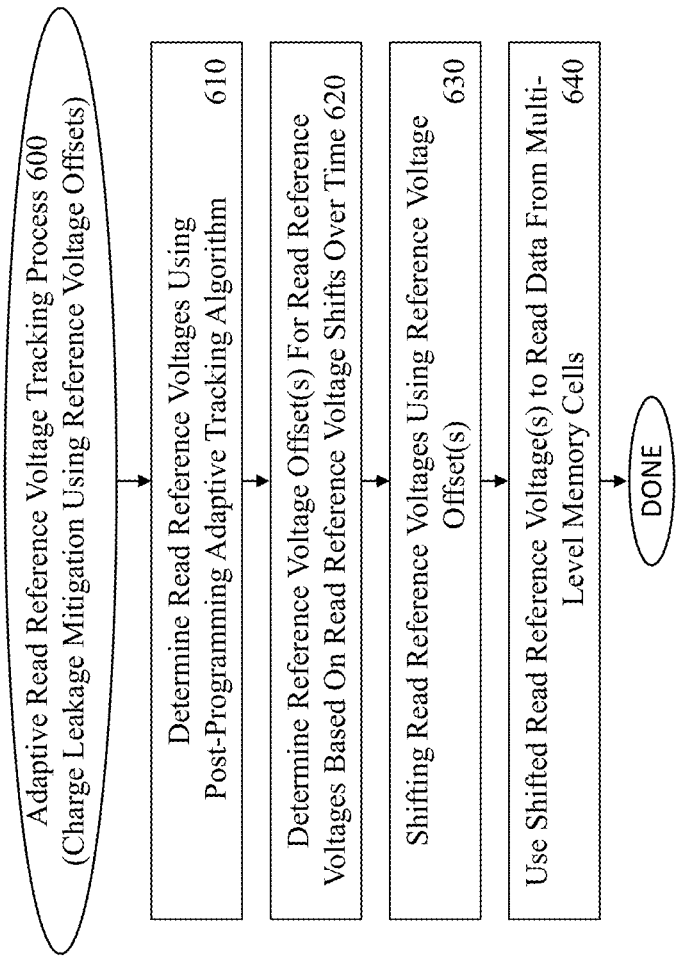
FIG. 6 is a flow chart illustrating an exemplary implementation of an adaptive read reference voltage tracking process with charge leakage mitigation using reference voltage offsets, according to one embodiment of the disclosure.

FIG. 6 is a flow chart illustrating an exemplary implementation of an adaptive read reference voltage tracking process 600 with charge leakage mitigation using reference voltage offsets, according to one embodiment of the disclosure. As shown in FIG. 6, the exemplary adaptive read reference voltage tracking process 600 initially determines the read reference voltages using a post-programming adaptive tracking algorithm during step 610. An online or offline post-programming adaptive tracking algorithm can be employed. For example, the post-programming adaptive tracking algorithm may be implemented using the techniques described in one or more of U.S. Pat. No. 9,036,413, entitled "Flash Memory Reference Voltage Detection With Tracking Of Cross-Points Of Cell Voltage Distributions Using Histograms; U.S. Pat. No. 9,417,797, entitled "Estimating Read Reference Voltage Based on Disparity and Derivative Metrics;" U.S. patent application Ser. No. 14/928,181, filed Oct. 30, 2015, entitled "Adaptive Read Threshold Voltage Tracking with Separate Characterization on Each Side of Voltage Distribution About Distribution Mean;" U.S. patent application Ser. No. 14/928,284, filed Oct. 30, 2015, entitled "Read Threshold Voltage Adaptation Using Bit Error Rates Based On Decoded Data;" and/or U.S. patent application Ser. No. 14/962,538, filed Dec. 8, 2015, entitled "Adaptive Read Threshold Voltage Tracking with Gap Estimation Between Default Read Threshold Voltages;" each incorporated by reference herein in its entirety.

In addition, the exemplary adaptive read reference voltage tracking process 600 determines one or more reference voltage offsets for the read reference voltages based on shifts in the read reference voltage over time during step 620. Exemplary techniques for determining the reference voltage offsets are discussed further below in a section entitled "Obtaining Bias Values."

The read reference voltages are shifted during step 630 using the determined reference voltage offsets. It is noted that step 630 is optionally performed only after a predefined charge leakage settling time, as discussed further below in conjunction with FIG. 7. The shifted read reference voltages are then used during step 640 to read data from multi-level memory cells.

In this manner, the exemplary adaptive read reference voltage tracking process 600 performs charge leakage mitigation by adding the determined reference voltage offset(s) to the read reference voltages determined by the adaptive read reference voltage tracking techniques.

Figure 7:
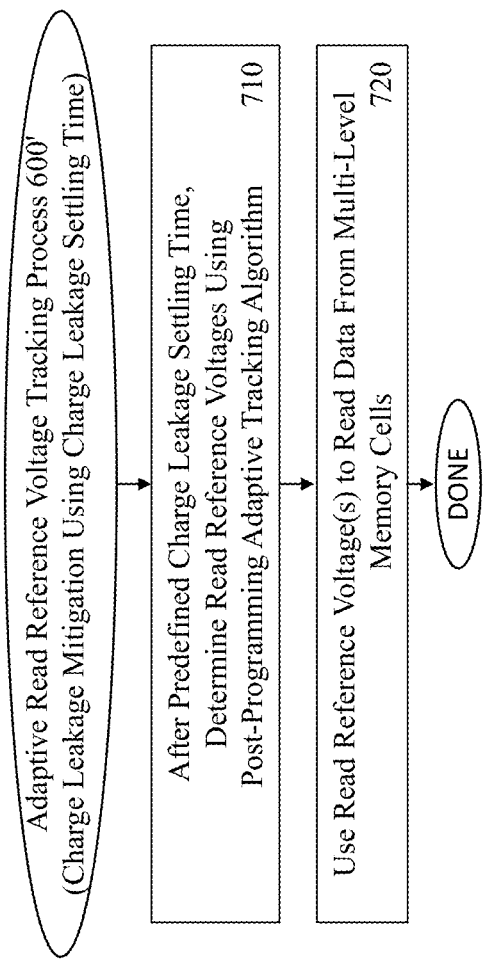
FIG. 7 is a flow chart illustrating an exemplary implementation of an adaptive read reference voltage tracking process with charge leakage mitigation using charge leakage settling times, according to an embodiment of the disclosure.

FIG. 7 is a flow chart illustrating an exemplary implementation of an alternative implementation of the adaptive read reference voltage tracking process 600' with charge leakage mitigation using charge leakage settling times, according to an embodiment of the disclosure. As shown in FIG. 7, after a predefined charge leakage settling time, the exemplary adaptive read reference voltage tracking process 600' determines the read reference voltages using the post-programming adaptive tracking algorithm during step 710. The post-programming adaptive tracking algorithm may be implemented in a similar manner as those referenced above for step 610.

The determined read reference voltages are then used during step 720 to read data from multi-level memory cells.

The determined read reference voltages can optionally be shifted using the reference voltage offsets, as discussed above in conjunction with FIG. 6.

In this manner, the exemplary alternative adaptive read reference voltage tracking process 600' of FIG. 7 delays the post-program tracking by the predefined charge leakage settling time in order to wait for the charge leakage to settle. The predefined charge leakage settling time may be obtained, for example, through data characterization. In various embodiments, the predefined charge leakage settling time can be fixed throughout the life of the memory device or be dependent on one or more of program-erase cycles, retention, and read disturb. In further variations, the predefined charge leakage settling time can be fixed for all (or a set of) blocks/pages that are processed by the post-program tracking, or can have a location dependency, as would be apparent to a person of ordinary skill in the art.

In one exemplary embodiment, the adaptive read reference voltage tracking techniques determine a set of read reference voltages, which are initially used to read data from the memory cells. After a predefined charge leakage settling time, the reference voltage offsets are added to the determined set of read reference voltages, and the shifted read reference voltages are then used to read data from the memory cells.

Figure 8A:
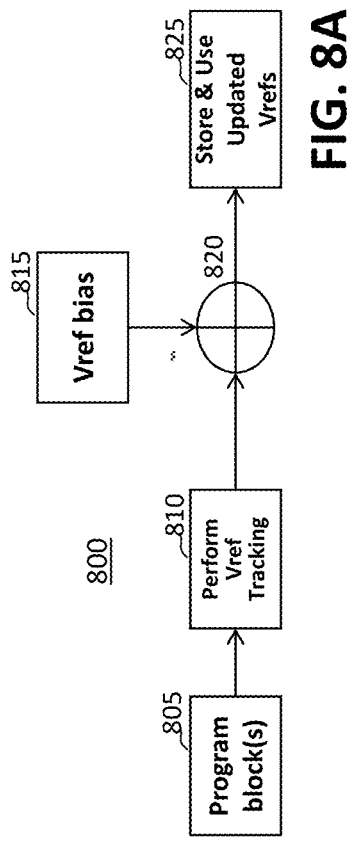
FIGS. 8A through 8C illustrate exemplary alternative implementations of the adaptive read reference voltage tracking process of FIG. 6, according to various embodiments of the disclosure.

FIG. 8A illustrates an exemplary implementation 800 of the adaptive read reference voltage tracking process 600 of FIG. 6, according to an embodiment of the disclosure. As shown in FIG. 8A, blocks of data in the memory are programmed at step 805, and the adaptive read reference voltage tracking techniques are applied during step 810.

The reference voltage offset(s) (e.g., $V_{ref}$ bias values) for the read reference voltages are obtained at step 815, are inverted, and then added to the read reference voltages using adder 820. As discussed further below, the reference voltage offset(s) can be wait time independent.

The updated read reference voltages are then stored and used to read data values at step 825.

Figure 8B:
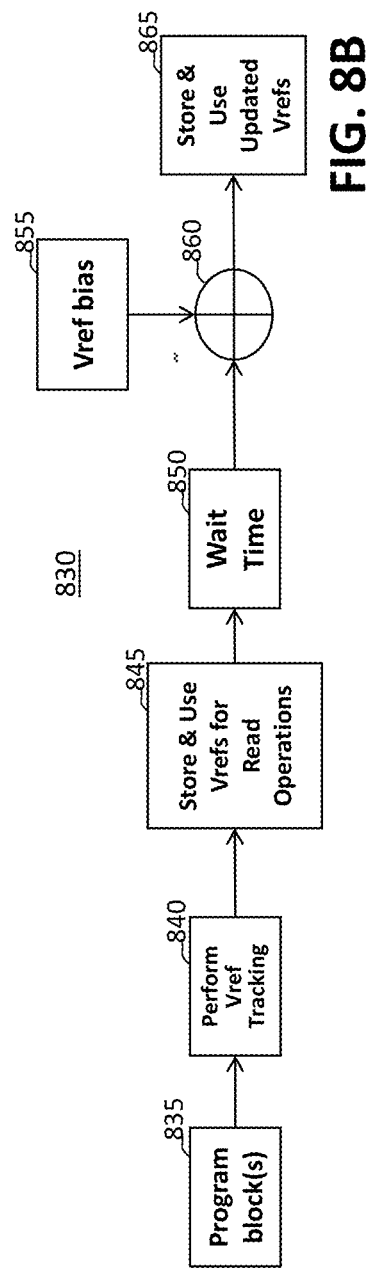

FIG. 8B illustrates an exemplary alternate implementation 830 of the adaptive read reference voltage tracking process 600 of FIG. 6, according to an alternate embodiment of the disclosure. Generally, the implementation 830 of FIG. 8B uses the initially determined read reference voltages after programming of the memory, and until the memory cells have settled, based on the expected charge leakage. Thereafter, the determined offsets are used to shift the read reference voltages. As shown in FIG. 8B, blocks of data in the memory are programmed at step 835, and the adaptive read reference voltage tracking techniques are applied during step 840, in a similar manner as FIG. 8A. The initial read reference voltages are then stored and immediately used to read data values at step 845.

After a predefined charge leakage settling time during step 850, the reference voltage offsets (e.g., $V_{ref}$ bias values) for the read reference voltages are obtained at step 855, are inverted, and then added to the initial read reference voltages using adder 860. The updated read reference voltages are then stored and used to read data values at step 865.

Figure 8C:
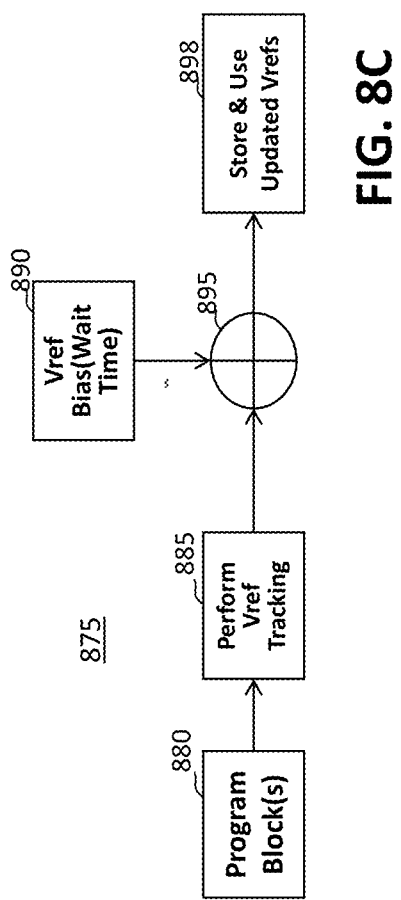

FIG. 8C illustrates an exemplary alternate implementation 875 of the adaptive read reference voltage tracking process 600 of FIG. 6, according to another embodiment of the disclosure. As shown in FIG. 8C, blocks of data in the memory are programmed at step 880, and the adaptive read reference voltage tracking techniques are applied during step 885, in a similar manner as FIGS. 8A and 8B.

During step 890, the reference voltage offsets (e.g., $V_{ref}$ bias values) for the read reference voltages are obtained, but the reference voltage offsets are now a function of the wait time. In this manner, the reference voltage offsets are adjusted over time, following the programming of step 880, to compensate for the current charge leakage. The variable reference voltage offsets (e.g., $V_{ref}$ bias values) for the read reference voltages are inverted, and then added to the read reference voltages using adder 895. The updated read reference voltages are then stored and used to read data values at step 898.

Figure 9A:
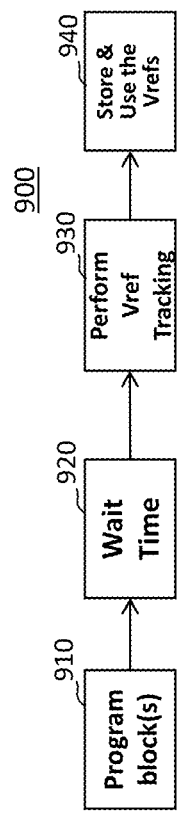
FIGS. 9A and 9B illustrate exemplary alternative implementations of the adaptive read reference voltage tracking process of FIG. 7, according to various embodiments of the disclosure.

FIG. 9A illustrates an exemplary implementation 900 of the adaptive read reference voltage tracking process 600' of FIG. 7, according to one embodiment of the disclosure. As shown in FIG. 9A, blocks of data in the memory are programmed at step 910. After a predefined charge leakage settling time during step 920, the adaptive read reference voltage tracking techniques are applied during step 930, in a similar manner as FIG. 8A, to obtain the read reference voltages. The determined read reference voltages are then stored and immediately used to read data values at step 940 (without any offsets).

It is noted that any read operations performed before the predefined charge leakage settling time expires at step 920, the prior values of the read reference voltages are used to read data.

Figure 9B:
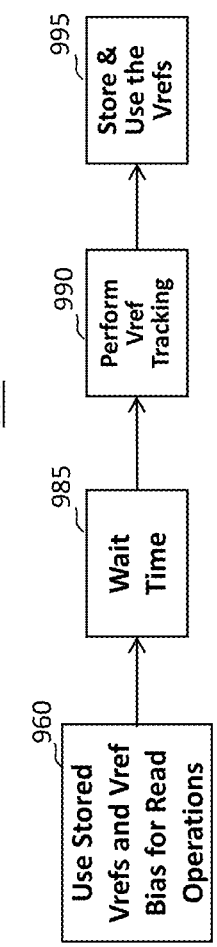

FIG. 9B illustrates an exemplary implementation 950 of the adaptive read reference voltage tracking process 600' of FIG. 7, according to another embodiment of the disclosure. Generally, in the embodiment of FIG. 9B, the previously tracked read reference voltages are biased prior to reading a newly programmed block until such time when the wait time is over. As shown in FIG. 9B, the stored read reference voltages (Vrefs) and reference voltage offsets (e.g., $V_{ref}$ bias values) are used for read operations at step 960.

After a predefined charge leakage settling time during step 985, the adaptive read reference voltage tracking techniques are applied during step 990, in a similar manner as FIG. 8A, to obtain the read reference voltages. The determined read reference voltages are then stored and used to read data values at step 995.

Obtaining Bias Values

In one or more embodiments, the applied reference voltage offsets for the read reference voltages are determined based on measured shifts in the read reference voltages over time, as discussed further below. Generally, the applied reference voltage offsets provide an adjustment to the read reference voltages to compensate for the charge leakage. The same offset can be used for all read reference voltages or a unique offset can be determined for each read reference voltage. The adaptive read reference voltage tracking techniques are executed to determine the substantially "optimal" or substantially "best" read reference voltages. The voltage tracking may be performed online or offline and is often dictated by controller architecture.

For a given test condition (e.g., PEC (program-erase cycles) and/or temperature settings), raw NAND data is collected from read operations at a plurality of read reference voltages spread across several blocks or super blocks. The data is collected at a predefined data collection frequency (T) following programming of the block or super block. Several data sets T-apart are collected until a predefined data collection duration since the programming of the block or super block.

The collected data is processed to compute the shift in the read reference voltages, over time. In one or more embodiments, the shift in the read reference voltages, over time, can be expressed as follows:

$$vshift[i][j]=Vref\_opt[i][j]-Vref\_opt[i][0],$$

where i is an index of the read reference voltages and j is a time counter (i varies between 0 and 2 for MLC cells and between 0-6 for TLC cells).

In this manner, the bias values may be obtained through data characterization.

The offset (or bias) for a given read reference voltage can be selected as follows:

Bias[i]=Pick median of vshift[i][0 to n]; or
Bias[i]=Pick mid-point of vshift[i][0] and vshift[i][n].

In various embodiments, bias vectors may be generated at different PEC intervals and temperature conditions, as discussed further below in conjunction with FIGS. 10 and 11.

The determined bias values can be fixed for the life of a given memory or be varied, dependent on PEC, retention and/or read disturb, as would be apparent to a person of ordinary skill in the art.

Figure 10:
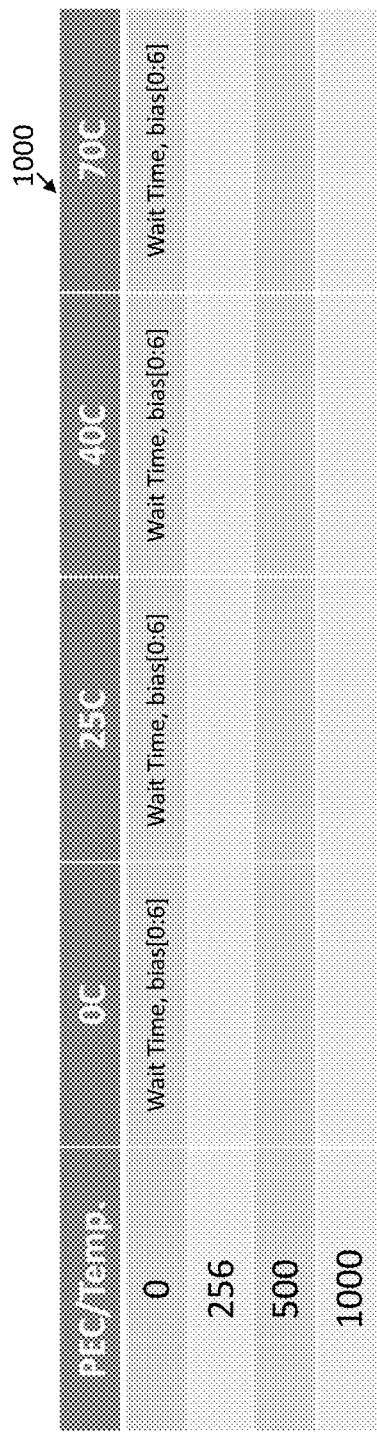
FIGS. 10 and 11 illustrate exemplary alternative implementations of reference voltage offset tables, according to various embodiments of the disclosure.

FIG. 10 illustrates an exemplary implementation of a reference voltage offset table 1000, according to one exemplary embodiment of the disclosure. As shown in FIG. 10, the exemplary reference voltage offset table 1000 comprises a different wait time and offset (bias) vector for each combination of PEC and temperature. As noted above, there are seven different offsets (counter i varies between 0-6) for the seven different read reference voltages associated with the exemplary TLC cells. The offsets indicated in the appropriate offset vector are applied to each read reference voltage after the indicated wait time, in accordance with the embodiment of FIG. 8B.

Figure 11:
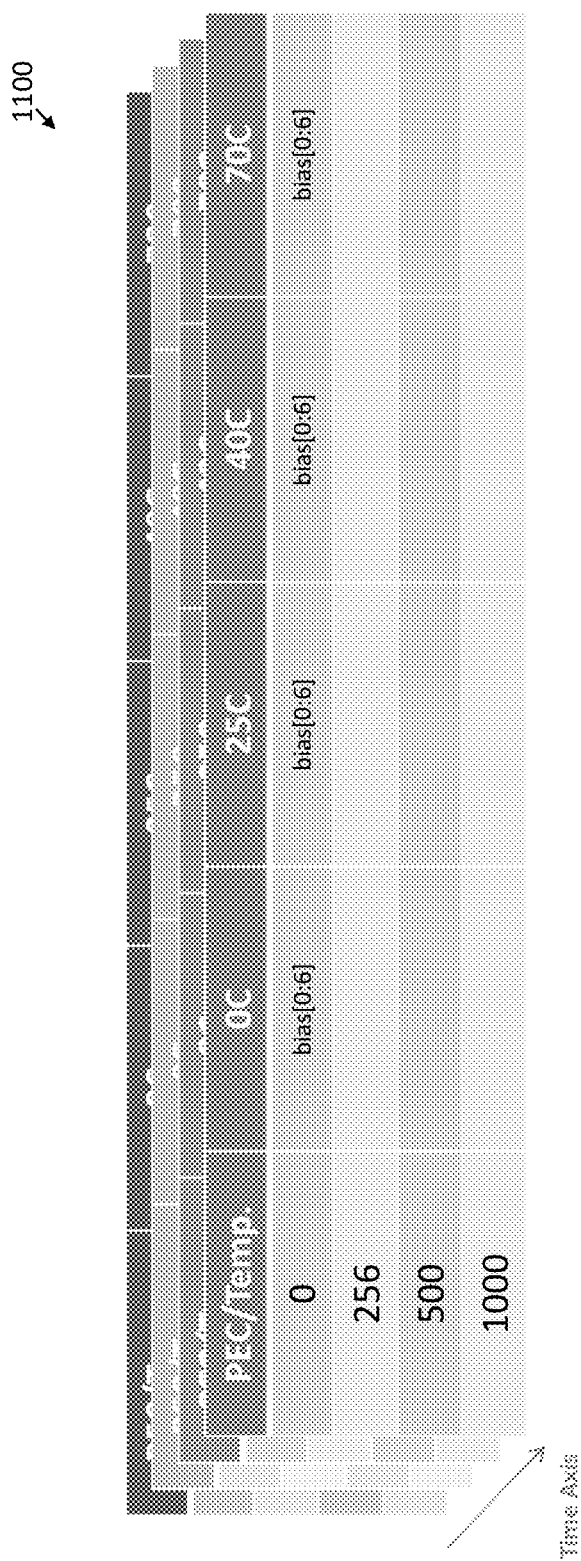

FIG. 11 illustrates an exemplary implementation of a reference voltage offset table 1100, according to an alternate embodiment of the disclosure. As shown in FIG. 11, the exemplary reference voltage offset table 1000 has an additional time axis for the wait time, relative to the table 1000 of FIG. 10, and comprises a different offset (bias) vector for each combination of wait time, PEC and temperature. As noted above, there are seven different offsets (counter i varies between 0-6) for the seven different read reference voltages associated with the exemplary TLC cells. The offsets indicated in the appropriate offset vector are applied to each read reference voltage as a function of the associated wait time, in accordance with the embodiment of FIG. 8C.

CONCLUSION

In one or more embodiments of the disclosure, techniques are provided for adapting read reference voltages that mitigate for charge leakage effects. In some embodiments, the mitigation techniques add one or more offsets to the read reference voltages.

It should be understood that the particular charge leakage mitigation arrangements illustrated in FIGS. 1 through 11 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements. For example, one or more embodiments provide significantly improved adaptive voltage tracking techniques since the read reference voltages are adjusted to account for the charge leakage effects.

It is to be appreciated that the particular advantages described above and elsewhere herein are associated with particular illustrative embodiments and need not be present in other embodiments. Also, the particular types of charge leakage mitigation features and functionality as illustrated in the drawings and described above are exemplary only, and numerous other arrangements may be used in other embodiments.

As mentioned previously, at least portions of the disclosed charge leakage mitigation system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform that may be used to implement at least a portion of an information processing system comprises cloud infrastructure including virtual machines. The cloud infrastructure further comprises sets of applications running on respective ones of the virtual machines. These and other types of cloud infrastructure can be used to provide what is also referred to herein as a multi-tenant environment. One or more system components such as controller 420 and/or encoder/decoder 430, or portions thereof, are illustratively implemented for use by tenants of such a multi-tenant environment.

The disclosed charge leakage mitigation arrangements may be implemented using one or more processing platforms. One or more of the processing modules or other components may therefore each run on a computer, storage device or other processing platform element. A given such element may be viewed as an example of what is more generally referred to herein as a "processing device."

Figure 12:
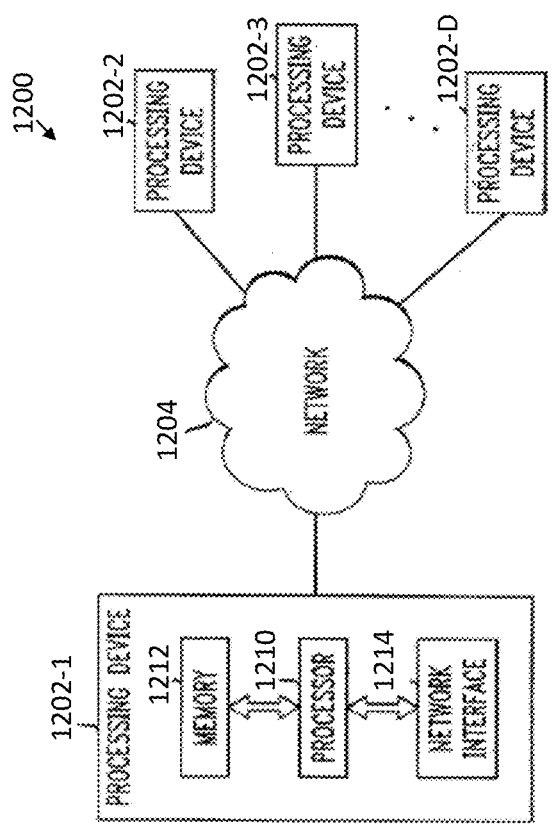
FIG. 12 illustrates a processing platform that may be used to implement at least a portion of one or more embodiments of the disclosure.

Referring now to FIG. 12, one possible processing platform that may be used to implement at least a portion of one or more embodiments of the disclosure is shown. The processing platform 1200 in this embodiment comprises at least a portion of the given system and includes at least one processing device(s), denoted 1202-1, 1202-2, 1202-3, . . . 1202-D, which communicate with one another over a network 1204. The network 1204 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 1202-1 in the processing platform 1200 comprises a processor 1210 coupled to a memory 1212. The processor 1210 may comprise a microprocessor, a microcontroller, an application specific integrated circuit (ASIC), a field programmable gate array (FPGA) or other type of processing circuitry, as well as portions or combinations of such circuitry elements. The memory 1212 may comprise random access memory (RAM), read only memory (ROM) or other types of memory, in any combination. The memory 1212 and other memories disclosed herein should be viewed as illustrative examples of what are more generally referred to as "processor-readable storage media" storing executable program code of one or more software programs.

Also included in the processing device 1202-1 is network interface circuitry 1214, which is used to interface the processing device with the network 1204 and other system components, and may comprise conventional transceivers.

The other processing devices 1202, if any, of the processing platform 1200 are assumed to be configured in a manner similar to that shown for processing device 1202-1 in the figure.

Again, the particular processing platform 1200 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 12, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 1200 shown in FIG. 12 is presented by way of example only, and the charge leakage mitigation system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the charge leakage mitigation system. Such components can communicate with other elements of the charge leakage mitigation system over any type of network or other communication media.

As indicated previously, components of an information processing system as disclosed herein can be implemented at least in part in the form of one or more software programs stored in memory and executed by a processor of a processing device. For example, at least portions of the functionality of the adaptive read reference voltage tracking process with charge leakage mitigation 600 of FIG. 6 or 600' FIG. 7 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and charge leakage mitigation systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A device for use with multi-level memory cells, comprising:
a controller configured to perform the following steps:
after a predefined time interval that is based on a settling time after a programming of the multi-level memory cells until a charge leakage of one or more of the multi-level memory cells has settled, determining a plurality of read reference voltages for the multi-level memory cells using a post-programming adaptive tracking algorithm; and
employing the plurality of read reference voltages to read data from the multi-level memory cells.

2. The device of claim 1, further comprising the step of employing the plurality of read reference voltages shifted by at least one reference voltage offset to read data from the multi-level memory cells during the predefined time interval.

3. The device of claim 2, wherein the shifting is performed until the charge leakage of the multi-level memory cells has settled.

4. The device of claim 2, wherein the at least one reference voltage offset is determined based on a shift in one or more of the read reference voltages after the predefined time interval since the programming of the multi-level memory cells.

5. The device of claim 2, wherein the at least one reference voltage offset varies over time in a manner that is based on the settling time after the programming of the multi-level memory cells until a charge leakage of the multi-level memory cells has settled.

6. The device of claim 2, wherein the at least one reference voltage offset is stored in at least one table that stores the at least one reference voltage offset for given values of one or more of a number of program-erase cycles (PEC), temperature and time.

7. A method for use with multi-level memory cells, comprising:
after a predefined time interval that is based on a settling time after a programming of the multi-level memory cells until a charge leakage of one or more of the multi-level memory cells has settled, determining a plurality of read reference voltages for the multi-level memory cells using a post-programming adaptive tracking algorithm; and
employing the plurality of read reference voltages to read data from the multi-level memory cells.

8. The method of claim 7, further comprising the step of employing the plurality of read reference voltages shifted by at least one reference voltage offset to read data from the multi-level memory cells during the predefined time interval.

9. The method of claim 8, wherein the shifting is performed until the charge leakage of the multi-level memory cells has settled.

10. The method of claim 8, wherein the at least one reference voltage offset is determined based on a shift in one or more of the read reference voltages after the predefined time interval since the programming of the multi-level memory cells.

11. The method of claim 8, wherein the at least one reference voltage offset varies over time in a manner that is based on the settling time after the programming of the multi-level memory cells until a charge leakage of the multi-level memory cells has settled.

12. The method of claim 8, wherein the at least one reference voltage offset is stored in at least one table that stores the at least one reference voltage offset for given values of one or more of a number of program-erase cycles (PEC), temperature and time.

13. A tangible machine-readable recordable storage medium, wherein one or more software programs when executed by one or more processing devices implement the steps of the method of claim 7.

14. An apparatus, comprising:
a memory; and
at least one processing device, coupled to the memory, operative to implement the following steps:
after a predefined time interval that is based on a settling time after a programming of the multi-level memory cells until a charge leakage of one or more of the multi-level memory cells has settled, determining a plurality of read reference voltages for the multi-level memory cells using a post-programming adaptive tracking algorithm; and
employing the plurality of read reference voltages to read data from the multi-level memory cells.

15. The apparatus of claim 14, further comprising the step of employing the plurality of read reference voltages shifted by at least one reference voltage offset to read data from the multi-level memory cells during the predefined time interval.

16. The apparatus of claim 15, wherein the shifting is performed until the charge leakage of the multi-level memory cells has settled.

17. The apparatus of claim 15, wherein the at least one reference voltage offset is determined based on a shift in one or more of the read reference voltages after the predefined time interval since the programming of the multi-level memory cells.

18. The apparatus of claim 15, wherein the at least one reference voltage offset varies over time in a manner that is based on the settling time after the programming of the multi-level memory cells until a charge leakage of the multi-level memory cells has settled.

19. The apparatus of claim 15, wherein the at least one reference voltage offset is stored in at least one table that stores the at least one reference voltage offset for given values of one or more of a number of program-erase cycles (PEC), temperature and time.

20. A storage controller comprising the apparatus of claim 14.

* * * * *